(12) United States Patent
Fahim et al.

(10) Patent No.: US 8,798,570 B2
(45) Date of Patent: Aug. 5, 2014

(54) ACCURATE RADIO FREQUENCY FILTERING USING ACTIVE INTERMEDIATE FREQUENCY FEEDBACK

(76) Inventors: Amr M. Fahim, Newport Beach, CA (US); Stephen A. Jantzi, Laguna Beach, CA (US); Afshin Mellati, Irvine, CA (US)

( * ) Notice: Subject to any disclaimer, the term of this patent is extended or adjusted under 35 U.S.C. 154(b) by 123 days.

(21) Appl. No.: 13/323,103

(22) Filed: Dec. 12, 2011

(65) Prior Publication Data

US 2013/0149983 A1    Jun. 13, 2013

(51) Int. Cl.
*H04B 1/16*    (2006.01)
*H03H 11/12*    (2006.01)
*H03H 11/46*    (2006.01)

(52) U.S. Cl.
USPC .......................... 455/307; 455/296

(58) Field of Classification Search
USPC .................... 455/296, 302, 307, 323
See application file for complete search history.

(56) References Cited

U.S. PATENT DOCUMENTS

| | | | |
|---|---|---|---|
| 6,597,899 B2 * | 7/2003 | Souetinov et al. ............ | 455/323 |
| 7,262,815 B2 | 8/2007 | Su | |
| 2003/0148748 A1 * | 8/2003 | Shah ............................ | 455/296 |

OTHER PUBLICATIONS

Sun, et al, "On-chip active RF tracking filter with 60dB 3rd order harmonic rejection for digital TV tuners", printed from <<http://ieeexplore.ieee.org/search/srchabstract.jsp?openedRefinements=*&arnumber=4815658&filter=AND(NOT(4283010803))&searchField=Search%20All&queryText=on-chip%20active%20rf%20tracking&openedRefinements=*&arnumber=4815658&filter=AND(NOT(4283010803))&searchField=Search%20All&queryText=on-chip%20active%20rf%20tracking>> on Feb. 1, 2010, 2 pages.

Fresco Microchip, Inc:FM2050, "Single-chip DVB-T and universal analog demodulator with IF processing for terrestrial and cable broadcasts", printed from << http://www.frescomicrochip.com/products_fm2050.html>> on Feb. 24, 2010, 1 page.

Wikipedia, "Heterodyne", printed from <<http://en.wikipedia.org/wiki/Heterodyning>> on Feb. 23, 2010, 5 pages.

Wikipedia, "Image Frequency", printed from <<http://en.wikipedia.org/wiki/Image_frequency>> on Feb. 23, 2010, 1 page.

Wikipedia, "Intermediate Frequency", printed from <<http://en.wikipedia.org/wiki/Intermediate_Frequency>> on Feb. 23, 2010, 3 pages.

Wikipedia, "Superheterodyne Receiver", printed from <<http://en.wikipedia.org/wiki/Superheterodyne_receiver>> on Feb. 23, 2010, 7 pages.

Fresco Microchip, Inc: FM2050, "DVB-T/Analog Demodulator for PC and TV Applications", Preliminary Product Brief, Fresco Microchip, Inc., Jan. 2008, 2 pages.

(Continued)

*Primary Examiner* — Blane J Jackson
(74) *Attorney, Agent, or Firm* — Trellis IP Law Group, PC

(57) ABSTRACT

A receiver, such as a television tuner, includes a radio frequency (RF) filter circuit. The RF filter circuit includes a filter, a first node, and a second node coupled to the filter, and a conversion signal path having an input coupled to the first node and an output coupled to the second node, the conversion signal path having an active mixer coupled between the first node and the second node. The active mixer can include, for example, a first transconductor and a first mixer coupled in series between the first node and the second node. The RF filter circuit further includes a feedback signal path having an input coupled to the second node and an output coupled to the first node, the feedback signal path including a second transconductor and a second mixer coupled in series between the second node and the first node.

24 Claims, 8 Drawing Sheets

(56) References Cited

OTHER PUBLICATIONS

Fresco Microchip, Inc:FM1100 Family, "Fully Integrated Worldwide Legacy Demodulator and Digital IF Processor Solutions for Terrestrial and Cable Broadcasts", Product Brief, Fresco Microchip, Inc., Apr. 2009, 2 pages.

Behbahani, F. et al "CMOS Mixers and Polyphase Filters for Large Image Rejection", IEEE Journal of Solid-State Circuits, vol. 36, No. 6, Jun. 2001, 15 pages.

U.S. Appl. No. 13/327,836, filed Dec. 16, 2011 entitled "Harmonic Cancellation for Frequency Conversion Harmonic Cancellation".

* cited by examiner

ACCURATE RADIO FREQUENCY FILTERING USING ACTIVE INTERMEDIATE FREQUENCY FEEDBACK

CROSS-REFERENCE TO RELATED APPLICATION

The present application is related to U.S. patent application Ser. No. 13/327,836, entitled "Harmonic Cancellation for Frequency Conversion Harmonic Cancellation," filed on Dec. 16, 2011, the entirety of which is incorporated by reference herein.

FIELD OF THE DISCLOSURE

The present disclosure relates generally to signal processing and more particularly to signal filtering.

BACKGROUND

Wideband wireless systems are increasingly prevalent in modern communication devices. Applications of wideband wireless systems include high-bandwidth digital communication devices such as 3G and 4G mobile telephony systems, wireless local area network or "Wi-Fi"-enabled systems, and television broadcast systems. The successful operation of such systems often is dependent on accurate radio frequency (RF) filtering.

In a typical wideband wireless system, an antenna is used to receive the entire wireless spectrum, which contains the desired RF signal as well as several undesired blockers. These undesired blockers include adjacent blockers near the frequency of the desired signal and far-out blockers farther away from the frequency of the desired RF signal. High-Q filters typically are tuned to perform band-pass filtering around the desired RF signal. High-Q filters typically are composed of discrete passive devices, such as resistors, capacitors, inductors, and varactors. This configuration mainly serves to attenuate the far-out blockers. The tuning of a high-Q filter typically is performed by means of a feedback signal from a RF tuner component, whereby the accuracy of the filter depends on the accuracy of the feedback signal. Moreover, the sharpness of the filter is a trade-off with the degree to which the desired signal is permitted to droop. The RF tuner component includes a low-noise amplifier (LNA) that amplifies the signal level in such a way that it is sufficiently above the noise floor of the successive blocks of the RF tuner chip. The resulting amplified signal is then fed into a down-conversion mixer that frequency translates the desired RF signal into an intermediate frequency (IF) signal. After down conversion, the IF signal is then further filtered by sharp low frequency filters (at an IF frequency) to attenuate the adjacent blockers.

Although filtering at IF typically can be performed more efficiently than filtering at RF, there are numerous reasons for filtering at RF. For one, RF filtering helps to reduce the total input power to the LNA of the RF tuner component by rejecting far-out blockers, which enhances the effective linearity of the LNA. In many instances, RF surface acoustic wave (SAW) filters or discrete RLC-based filters are used to provide this RF filtering. Such implementations, however, tend to increase overall system costs.

Another reason for RF filtering is image rejection. In a typical RF-to-IF conversion process, a single down-converter mixer down converts the RF spectrum into an IF signal using a local oscillator (LO). The LO typically is a periodic signal having a primary frequency $f_{LO}$ and which typically is generated by an on-chip device, such as a phase-locked loop (PLL). The down-converter mixer produces frequency terms that are the sums and differences between the positive and negative values of the frequencies of signals found in the RF spectrum, including the frequency $f_{CH}$ of the desired RF signal and the frequency $f_{BL}$ of an undesired blocker. The relevant frequency terms are the difference products $f_{CH}-f_{LO}$, $f_{LO}-f_{ch}$, $f_{BL}-f_{LO}$, and $f_{LO}-f_{BL}$. Assuming that a low-pass filter (LPF) following the down-converter mixer attenuates the sum terms produced by the down-converter mixer and assuming that the separation in frequency between the desired RF signal and the undesired blocker to the LO are equal to one another, the IF spectrum will be composed of the desired signal overlapping in frequency, or smearing, with the undesired blocker. Accordingly, when an undesired blocker satisfies the condition that the separations in frequency between the desired RF signal and between the undesired blocker and the LO are equal to one another, the undesired blocker is said to lie in the image frequency of the desired signal. Image rejection then becomes the process of inhibiting the RF content at the image frequency or canceling the RF energy at the image frequency when down converting to an IF signal.

One conventional approach for image rejection relies on a dual-conversion architecture, or a heterodyne, architecture. In this instance, two mixers are utilized. The first mixer converts the RF spectrum into an initial IF spectrum. A high frequency for the initial IF spectrum results in a greater separation between the LO frequency and the RF signal, and thus the image also is further in frequency from the LO frequency. This greater separation thus enables a reasonably low-cost filter to be used to filter out the image. Once the image has been removed, the second mixer is then required to frequency translate the resulting signal into the desired final IF spectrum. Such topologies, however, require two high-performance local oscillators, one for each of the two mixers, and careful frequency planning is needed to avoid undesired overlap of mixing terms between the two mixers. Another conventional approach for image rejection implements a complex image reject mixer that cancels the image through the appropriate phase subtractions using a resistive-capacitive (RC) polyphase filter after the down-conversion mixer. Device mismatch of resistors and capacitors limits the performance of this approach.

Another reason for filtering in the RF domain is to filter out the spectrum near the harmonics of the LO signal. This process is commonly referred to as harmonic reject filtering. The need for harmonic reject filtering is particularly acute when the LO signal is a square waveform, which has strong odd order harmonic terms. When driven by a square wave LO, the down-converter mixer downconverts the RF spectrum near LO frequency to IF, as well downconverting the spectrum near the odd-order harmonics of the LO frequency to IF. Accordingly, any blockers near the odd-order harmonics of the LO frequency, and particularly the third-order and fifth-order harmonics, will fold onto the desired signal. This is usually addressed by having sufficient RF filtering before the mixer. This situation can be better understood by considering equation 1 below, which is a Fourier Series representation of a square wave form:

$$sq(t) = \frac{4}{\pi}\sum_{n=0}^{\infty}\frac{1}{2n+1}\sin[(2n+1)2\pi f_0 t] \qquad \text{EQ. 1}$$

where t is time (in seconds) and $f_0$ is the LO frequency (in Hz). As equation 1 illustrates, a square wave can be represented as an infinite sum of sinusoidal signals operating at odd order harmonics of the LO frequency scaled by progressively decreasing coefficients. This demonstrates that blockers near the third-order harmonic (that is, $3*f_{LO}$) and the fifth-order harmonic (that is, $5*f_{LO}$) would be downconverted by the mixer to IF and would add to the desired signal at IF, effectively smearing the desired signal.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-13 illustrate techniques for signal filtering for use in radio frequency (RF)-based devices. For ease of illustration, these techniques are described in the context of a RF receiver or tuner of a TV system. However, these techniques are not limited to this context, but may be implemented in any of a variety of RF systems, such as ultra-wideband receivers, software-defined radios, medical imaging transceivers, and the like. Moreover, the techniques described herein are not limited to implementation in receivers, but may also be used for filtering of signals for transmitter systems.

Figure 1:
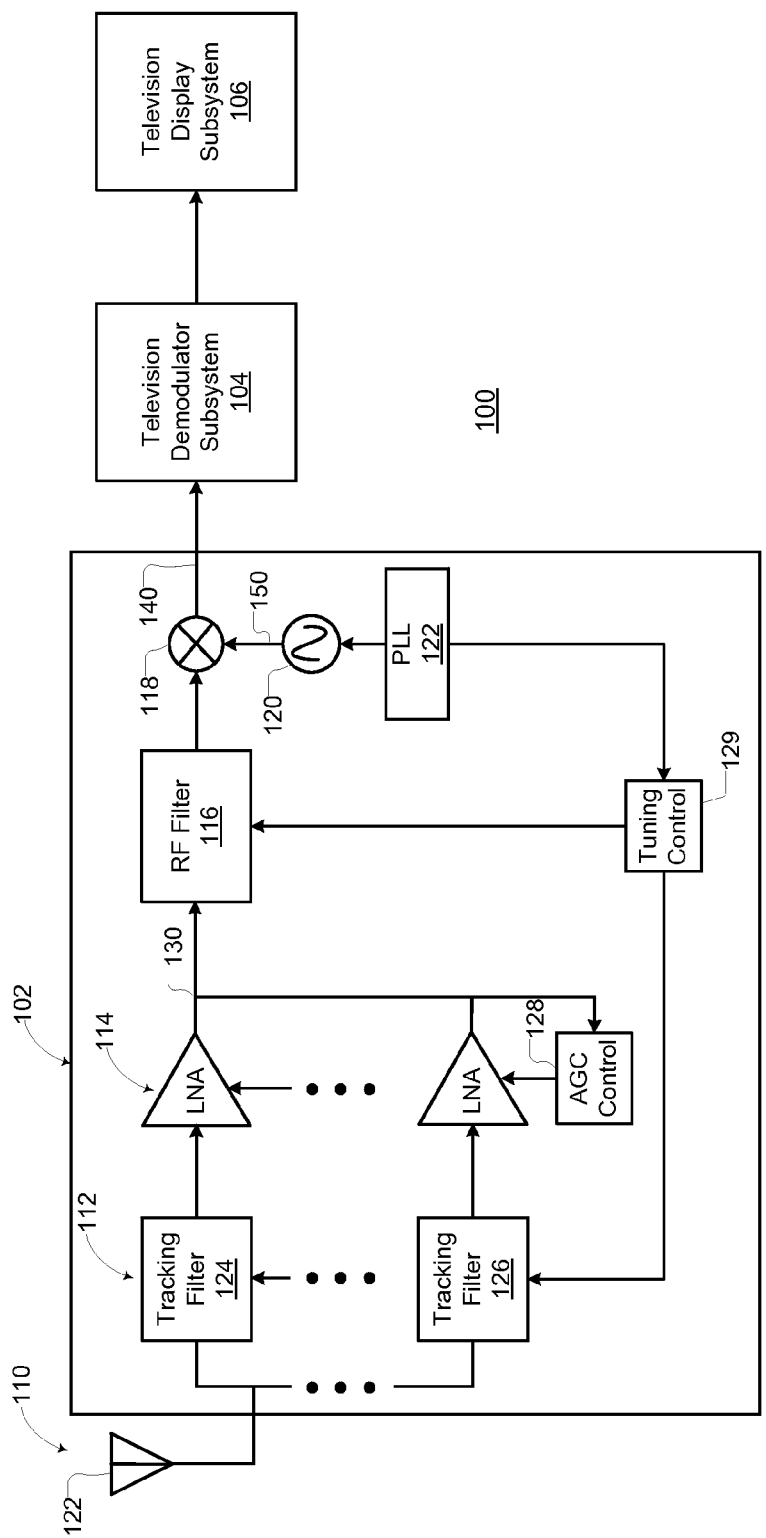
FIG. 1 is a diagram illustrating an example conventional television system that may implement improved radio-frequency (RF) filtering techniques in accordance with at least one embodiment of the present disclosure.

FIG. 1 illustrates an example television system 100 incorporating one or more of the improved RF filtering techniques described herein. The television system 100 includes a television (TV) tuner 102, a TV demodulator subsystem 104, and a TV display subsystem 106. In operation, the TV tuner 102 receives RF-based signaling, tunes to a particular RF band associated with a channel of interest, and down converts the signaling within the RF band to a lower-frequency intermediate frequency (IF) signal. The TV demodulator subsystem 104 processes the IF signal to extract the multimedia data embedded in the IF signal. The TV demodulator subsystem 104 then processes the extracted multimedia content for storage, display, subsequent transmission, or a combination thereof. To illustrate, the received RF signal can represent encoded multimedia data, which is obtained by the TV demodulator subsystem 104 by demodulating the IF signal. The TV display subsystem 106 then decodes the encoded multimedia data for display. As another example, the television system 100 can include a digital video recorder (DVR) or set-top box whereby the encoded multimedia data can be either decoded as it is received for a real time display or stored for later decoding and display.

The TV tuner 102, in one embodiment, includes an RF interface 110, a front-end tuned filter unit 112, an amplification unit 114, a RF filter unit 116 (e.g., a second tracking filter unit), a complex downconverter 118, and a local oscillator (LO) 120 controlled by a phase-locked loop (PLL) 122. The RF interface 110 can include, for example, an antenna 122 or a coaxial cable interface. The front-end tuned filter unit 112 can include one or more tracking filters (such as tracking filters 124 and 126) to band-pass filter a particular RF band and the amplification unit 112 can include at least one low noise amplifier (LNA) to amplify the tuned RF signal. The tracking filters of the front-end tuned filter unit 112 can be implemented as, for example, high-Q varactors, resistors, capacitors, and inductor elements, and the like. The amplification unit 112 further can include an automatic gain control (AGC) unit 128 to control the gain implemented by an active LNA. In one embodiment, only one tracking unit is active at a time, and the front-end tuned filter unit 112 therefore includes a tuning control unit 129 to activate a particular set of tracking filters and corresponding LNA based on tuning information received from the PLL 122. The tuning information can include, for example, information indicating the selection of a particular television channel, in response to which the tuning control unit 129 activates the tracking filter associated with the RF band that includes the selected television channel. In conventional systems, control of filter center frequencies of tracking filters generally requires a complex tuning control unit and several off-chip components to implement the filter, which increases system cost.

The active tracking filters and active LNA operate to generate an RF signal 130. In at least one embodiment, the RF filter unit 116, optionally in combination with the downconverter 118, may implement one or more of the novel RF filtering techniques described herein for harmonic reject filtering or image rejection for the RF signal 130. The downconverter 118 operates to downconvert the RF signal 130, or a filtered representation thereof, to a corresponding IF signal 140 that is then provided to the television demodulator subsystem 104 for processing as described above. The downconverter 118 mixes the RF signal 130 down to an IF signal 140 by a reference signal 150 provided by the LO 120. To produce an accurate signal, the LO 120 can be controlled by the PLL 122, which determines the LO frequency with high precision.

In one embodiment, the TV tuner 102 is substantially implemented as a single integrated circuit (IC) package. To illustrate, with the exception of the antenna 122 and any external filters or tuning components, the components of the TV tuner 102 can be implemented in, for example, a 48-pin quad flat no-leads (QFN) package. Due to the improved RF filtering provided by the RF filter block 116 as described herein, the IC package can provide a greater degree of decimation of unwanted signal content compared to conventional approaches, thereby facilitating the implementation of less-complex and smaller filtering components. To illustrate, the inventors have found that particular implementations of the RF filtering techniques described herein achieve RF filtering of 30 dB or more, and thus requiring external filtering that provides only 6 dB for an example context whereby a total reduction of at least 36 dB is deemed appropriate.

Figure 2:
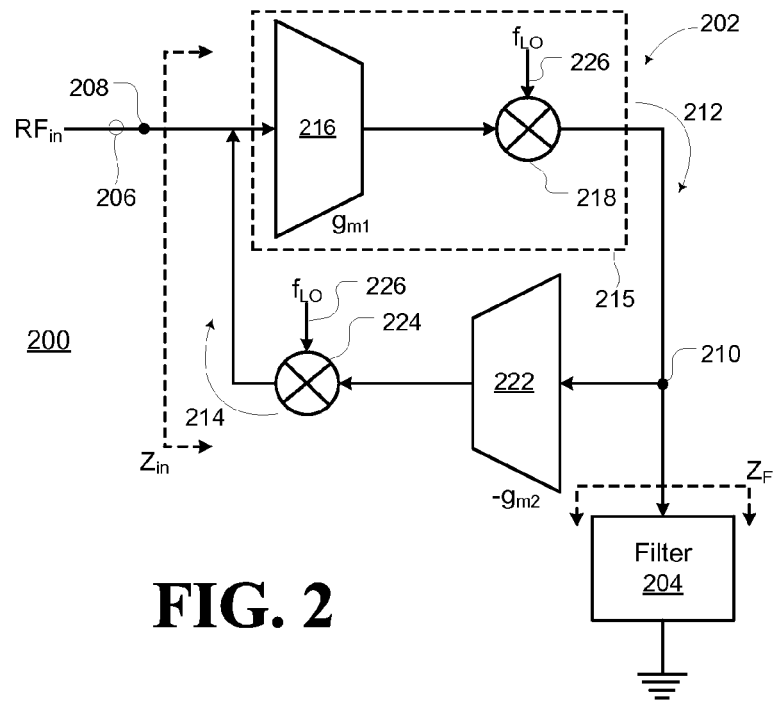
FIG. 2 is a circuit diagram illustrating an example RF filter using an intermediate frequency (IF)-based active feedback signal path in accordance with at least one embodiment of the present disclosure.

As noted above, sharp tracking filters are necessary for conventional TV tuner subsystems. Conventional tracking filters require expensive components such as high-Q varactors and several off-chip discrete components, which prevents chip integration. Such components vary with process and operating conditions and usually require tuning, which in turn increases complexity and cost even further. FIGS. 2-13 illustrate various techniques for sharp RF filtering through the use of feedback from an IF-based filter in a manner that avoids or substantially mitigates these issues. In particular, FIG. 2 illustrates an RF filter circuit 200 for providing sharp RF filtering using an IF-based filter and FIGS. 3-13 illustrate various expansions and adaptations of the circuit of FIG. 2 to achieve particular filtering configurations.

In the depicted example of FIG. 2, the RF filter circuit 200 employs an integrated feedback current-domain impedance feedback mechanism using a transconductor and mixer in the signal path to transfer a frequency-dependent current domain-based impedance of a filter from IF to RF. The RF filter circuit 200 includes a frequency translation loop circuit 202 and one or more filters 204 on an IF port of the frequency translation loop circuit 202 such that the filter 204 and the frequency translation loop circuit 202 are coupled in series between a signal path for an RF signal 206 and a fixed voltage reference (e.g., ground). The frequency translation loop circuit 202 includes a node 208 coupled to the signal path of the RF signal 206, a node 210, an RF-to-IF conversion signal path 212 having an input coupled to the node 208 and an output coupled to the node 210, and an IF-to-RF conversion signal path 214 having an input coupled to the node 210 and an output coupled to the node 208. The filter 204 is coupled between the node 210 and the voltage reference, and can comprise any of a variety of current-domain filters, such as a complex band-pass filter, a real band-pass filter, a low-pass filter, and the like.

The RF-to-IF conversion signal path 212 includes an active mixer 215 coupled between the node 208 and node 210 for conversion of the RF signal 206 to an IF signal. Although any of a variety of active mixer implementations for IF-to-RF conversion may be used for the active mixer 215, FIG. 2 and the subsequent figures depict an example, non-limiting implementation of the active mixer as a transconductor and a mixer (e.g., a quad-pair switch mixer) coupled in series. Accordingly, the active mixer 215 includes, in this example context, a transconductor 216 and a mixer 218 coupled in series between the node 208 and the node 210. The RF-to-IF conversion signal path 214 includes a transconductor 222 and a mixer 224 coupled in series between the node 210 and the node 208. The mixers 218 and 224 both receive a reference signal 226 having a frequency $f_{LO}$. The transconductor 216 has a transconductance of $g_{m1}$ and the transconductor 222 has a transconductance of $-g_{m2}$. In the depicted example, the mixers follow the respective transconductors; that is, the input of the transconductor 216 is coupled to the node 208, the output of the transconductor 216 is coupled to the input of the mixer 218, the output of the mixer 218 is coupled to the node 210, the input of the transconductor 222 is coupled to the node 210, the output of the transconductor 222 is coupled to the input of the mixer 224, and the output of the mixer 224 is coupled to the node 208. In an alternative embodiment, the order of transconductor and mixer are switched; that is, the input of the mixer 218 is coupled to the node 208, the output of the mixer 218 is coupled to the input of the transconductor 216, the output of the transconductor 216 is coupled to the node 210, the input of the mixer 224 is coupled to the node 210, the output of the mixer 224 is coupled to the input of the transconductor 222, and the output of the transconductor 222 is coupled to the node 208.

In operation, the RF-to-IF conversion signal path 212 converts the RF signal 206 to a current domain-based IF signal, which is filtered by the filter 204 in accordance with the frequency-dependent impedance transfer function $Z_F$ of the filter 204. The IF-to-RF conversion signal path 214 translates the impedance transfer function $Z_F$ of the filter 204 from IF to RF, and the translated impedance of the filter 204 is fed back into node 208. The impedance $Z_{in}$ at the node 208 thus can be represented by a transfer function expressed as:

$$Z_{in}(\omega) = \frac{1}{g_{m1}g_{m2}Z_F(\omega - \omega_{LO})} \qquad \text{EQ. 2}$$

Equation 2 above demonstrates two aspects of the RF filter circuit 200. First, the center frequency of the transfer function of the filter 204 at RF is translated from IF by an amount equal to the frequency $f_{LO}$ of the reference signal 226. The reference signal 226 can include a LO frequency derived from or controlled by a PLL and thus can have a precise output frequency. As such, the center frequency of the RF filter circuit 200 would not need to be calibrated and the filter 204 would not need to have a relatively high Q. Rather, the effective Q of the filter 204 would increase with frequency because the bandwidth of the filter 204 is constant regardless of center frequency (recalling that the Q of a filter is defined as the center frequency of the filter divided by the 3 dB bandwidth of the filter).

Figure 3:
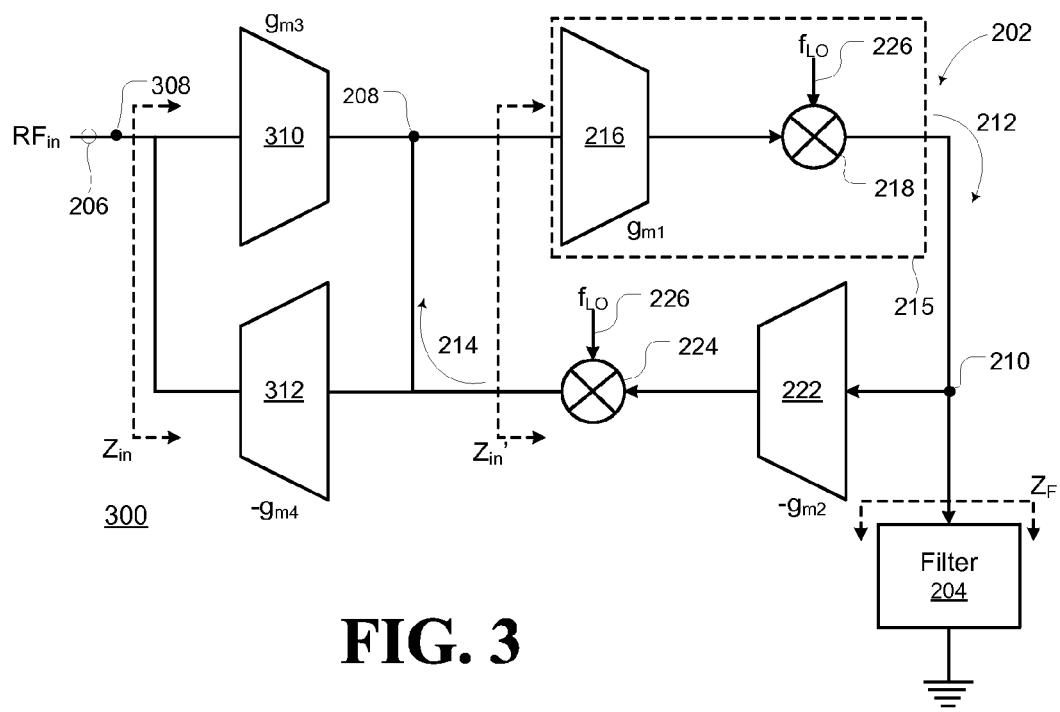
FIG. 3 is a circuit diagram illustrating another example RF filter using an intermediate frequency (IF)-based active feedback signal path in accordance with at least one embodiment of the present disclosure.

The second aspect revealed by Equation 2 is that the transfer function at the RF node (node 208) is the inverse of the transfer function at the IF node (node 210). FIG. 3 illustrates an RF filter circuit 300 that expands on the RF filter circuit 200 by using another set of back-to-back transconductors to counteract the inversion of the transfer function resulting from the RF circuit 200 of FIG. 2. In the depicted example of FIG. 3, the RF filter circuit 300 includes the filter 204 and frequency translation loop circuit 202 described above. However, rather than feeding the RF signal 206 directly into the node 208, the RF filter circuit 300 includes back-to-back transconductors 310 and 312 disposed between the node 208 and a node 308, whereby the node 308 receives the RF signal 206. The transconductor 310 (with transconductance $g_{m3}$) has an input coupled to the node 308 and an output coupled to the node 208. The transconductor 310 (with transconductance $-g_{m4}$) has an input coupled to the node 208 and an output coupled to the node 308. The impedance $Z_{in}$ at the node 308 thus can be represented by a transfer function expressed as:

$$Z_{in}(\omega) = \frac{g_{m1}g_{m2}}{g_{m3}g_{m4}} Z_F(\omega - \omega_{LO})$$ EQ. 3

In the event that the transconductances are equal, that is, $g_{m1}=g_{m2}=g_{m3}=g_{m4}$, then the transfer function represented by Equation 3 reduces to:

$$Z_{in}(\omega)=Z_F(\omega-\omega_{LO})$$ EQ. 4

As Equations 2-4 demonstrate and as illustrated in greater detail herein, by using the circuit of FIG. 2 or FIG. 3 as a shunt impedance at its node 208 or 308 respectively, which may be coupled to node 130 (FIG. 1) and the input of downconverter 118, or alternatively, prior to the/an LNA, a variety of RF filtering functions can be achieved, based on the particular IF filter implementation for the filter 204. The order of the IF filter implemented as filter 204 produces varying degrees of sharpness of the RF filtering. The trade-off of higher-orders of filtering is loop stability.

Although FIGS. 2 and 3 depict a single filter 204, the RF filter circuits 200 and 300, and their variations described below, can instead implement multiple filters 204 with different characteristics to achieve a particular frequency response. The multiple filters 204 can be connected to the node 210 in series, in parallel, or some combination thereof. To illustrate, two filters 204 with different center frequencies could be implemented, thereby resulting in a frequency response with two passbands, each passband centered at the center frequency of one of the filters 204.

Figure 4:
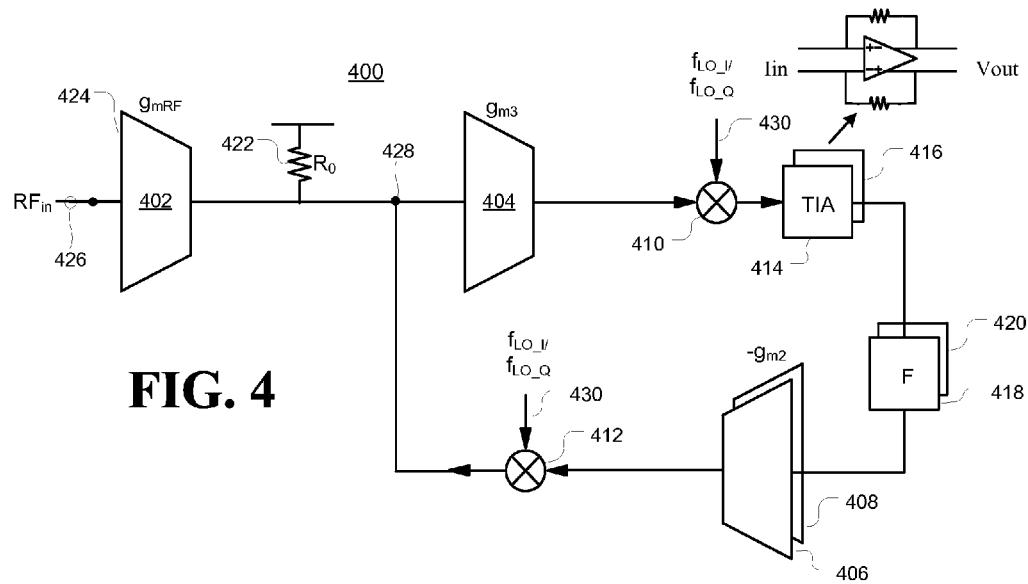
FIG. 4 is a circuit diagram illustrating an example RF notch filter using an intermediate frequency (IF)-based active feedback signal path in accordance with at least one embodiment of the present disclosure.
Figure 5:
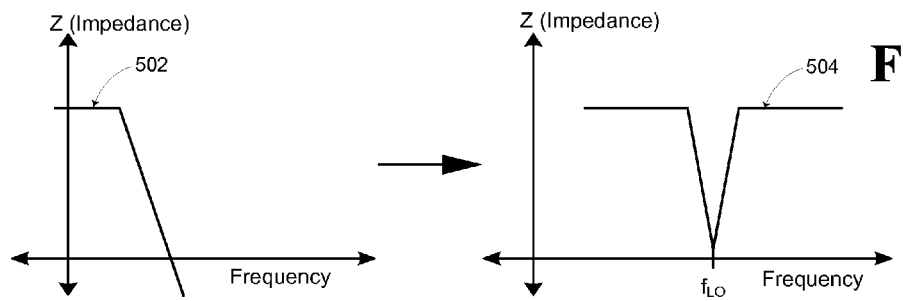
FIG. 5 is a diagram illustrating an example impedance transfer function of the RF notch filter of FIG. 4 using a low-pass IF filter in accordance with at least one embodiment of the present disclosure.
Figure 6:
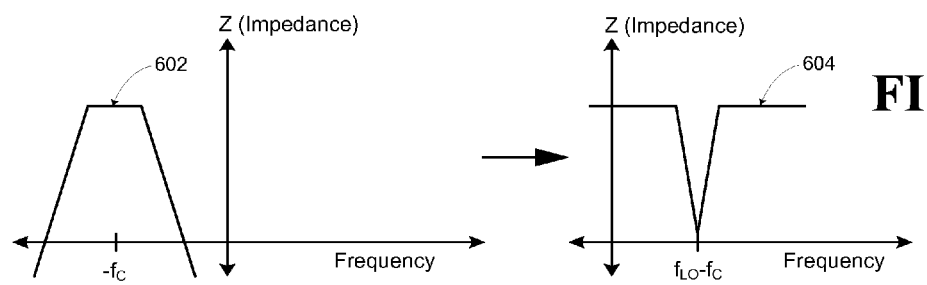
FIG. 6 is a diagram illustrating an example impedance transfer function of the RF notch filter of FIG. 4 using a complex band-pass IF filter in accordance with at least one embodiment of the present disclosure.

FIGS. 4-6 illustrate an RF notch filter circuit 400 implementing the structure of the RF filter circuit 300 of FIG. 3 in accordance with at least one embodiment of the present disclosure. The RF notch filter 400 includes transconductors 402, 404, 406, and 408, complex mixers 410 and 412, transimpedance amplifiers (TIAs) 414 and 416, IF filters 418 and 420, and a pull-up resistor 422. The transconductor 402 (with transconductance $g_{mRF}$) acts as a buffer for an RF signal 426 and includes an input coupled to a node 424 to receive the RF signal 426 and an output coupled to a node 428. The pull-up resistor 422 includes an electrode coupled to the node 428 and another electrode coupled to a voltage reference (e.g., $V_{DD}$). The transconductor 404 (with transconductance gm3) has an input coupled to the node 428 and an output coupled to an input of the complex mixer 410. The complex mixer 410 has another input to receive a complex reference signal 430 with an I component having a frequency $f_{LO\_I}$ and a Q component having a frequency $f_{LO\_Q}$. The complex mixer 410 converts the output of the transconductor 404 to a complex IF signal, whereby the I component and the Q component of the resulting IF signal are input to the TIA 414 and the TIA 416, respectively. The I component output of the TIA 414 is filtered by the filter 418, and the output of the filter 418 is input to the transconductor 406 (with a transconductance $-g_{m2}$). The Q component output of the TIA 416 is filtered by the filter 420, and the output of the filter 420 is input to the transconductor 408 (with a transconductance $-g_{m2}$). The I component output of the transconductor 406 and the Q component output of the transconductor 408 are upconverted to RF by the complex mixer 412 using the I component and Q component of the reference signal 430. The output of the complex mixer 412 is fed back to node 428. Although FIG. 4 illustrates a particular order of the transconductors 404 and 406/408 and complex mixers 410 and 412, the order of these transconductors and mixers can be switched in alternative embodiments.

The RF notch filter circuit 400 can be used to attenuate a problematic blocker at a certain frequency, such as a blocker near the image frequency or a blocker near a harmonic frequency. When a blocker is near the frequency $f_{LO}$ of the reference signal 430, the blocker is downconverted to baseband and the filters 418 and 420 will filter out all other signals and pass the blocker back to the mixer 412 for upconversion, whereby the upconverted blocker is then subtracted from the original RF spectrum. The input 426 may be coupled to node 130 (FIG. 1), and the RF output signal is available as a voltage at node 428, for the input of downconverter 118 in FIG. 1. Alternatively, the circuit may be used as a frequency-dependent shunt impedance prior to the/an LNA.

The notch filter function of the RF notch filter circuit 400 can be achieved through the use of either a low-pass filter or a complex band-pass filter. FIG. 5 illustrates an example impedance transfer function of the RF notch filter circuit 400 when a low-pass filter is used for the filters 418 and 420. As illustrated by FIG. 5, the operation of the RF notch filter circuit 400 transforms the impedance transfer function 502 of a low-pass filter implementation of filters 418 and 420 that is centered at DC (0 hertz) into an impedance transfer function 504 of a notch filter having a stop-band or notch centered at frequency $f_{LO}$. FIG. 6 illustrates an example impedance transfer function of the RF notch filter circuit 400 when a complex band-pass filter is used for the filters 418 and 420. As illustrated by FIG. 6, the operation of the RF notch filter circuit 400 transforms the impedance transfer function 602 of a complex band-pass filter having a pass-band centered at a frequency $-f_c$ into an impedance transfer function 604 of a notch filter having a notch or stop-band centered at a frequency $f_{LO}-f_c$. As illustrated by FIG. 6, the center of the notch is away from the frequency $f_{LO}$ when a complex band-pass filter is used, thereby circumventing issues that can arise from LO feed-through since the LO signal is removed from the desired attenuation region.

Figure 7:
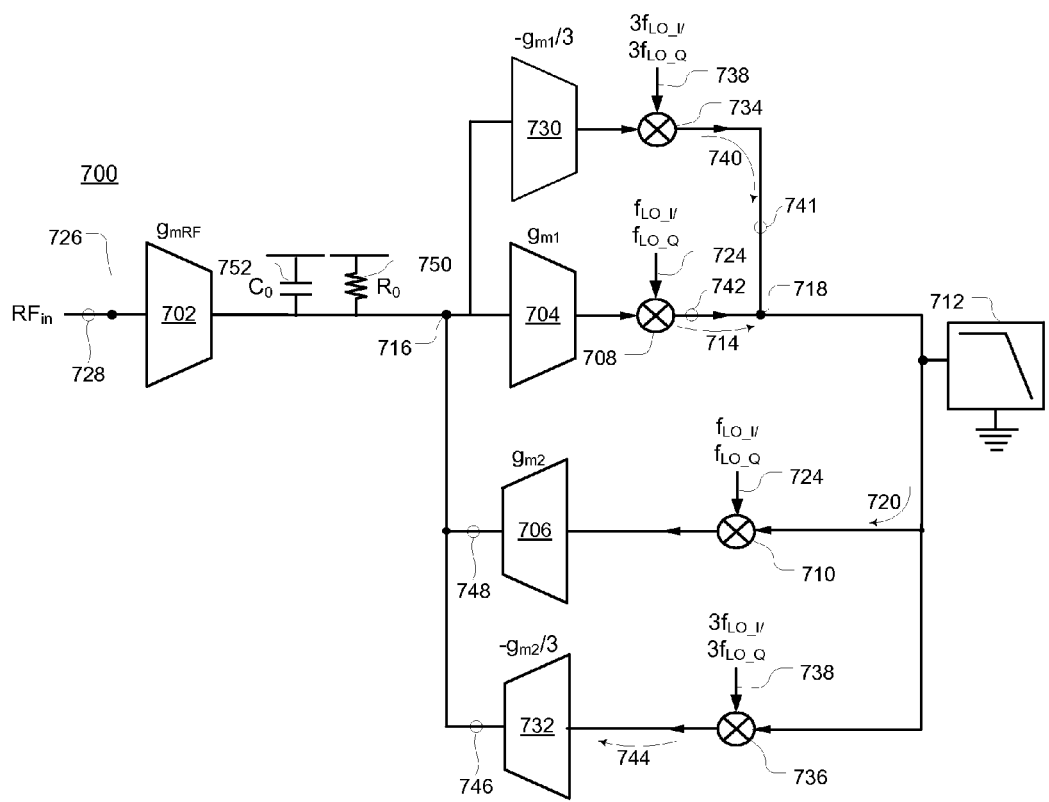
FIG. 7 is a circuit diagram illustrating an example RF filter using a combination of harmonic cancellation and IF-based active feedback in accordance with at least one embodiment of the present disclosure.

For the reasons described above, the use of a square wave for the reference signal 430 in the RF notch filter circuit 400 can result in the modulation of odd-order harmonics into the upconverted signal. The harmonic content in the upconverted signal can then be downcoverted by one of the odd-order harmonics of the LO in the downconverted signal. This effect of remodulation of the RF signal near the harmonics of the clock can lower the filter depth of the proposed filters. FIG. 7 illustrates an example RF notch filter circuit 700 to cancel the third order harmonic of the LO and hence improve notch depth. The illustrated RF notch filter circuit implements the IF-to-RF filter impedance conversion and feedback as described above through the use of transconductors 702, 704, and 706, complex mixers 708 and 710, and a complex current-domain filter 712. The transconductor 704 (with a transconductance $g_{m1}$) and the complex mixer 708 form an RF-to-IF conversion signal path 714 having an input coupled to a node 716 and an output coupled to a node 718 and the complex mixer 710 and the transconductor 706 (with a transconductance $g_{m2}$) form an IF-to-RF feedback signal path 720 with an input coupled to a node 718 and an output coupled to node 716. The complex mixers 708 and 710 receive a complex reference signal 724 having a frequency $f_{LO}$ (with an I component $f_{LO\_I}$ and a Q component $f_{LO\_Q}$). The complex filter 712 is coupled between the node 718 and a voltage reference (e.g., ground) and can be implemented as, for example, a low-pass filter centered at DC. The transconductor 702 serves as a buffer to connect the node 716 to a node 726 that receives an RF signal 728.

The RF notch filter circuit 700 further implements the harmonic cancellation technique described above through the use of transconductors 730 and 732 and complex mixers 734 and 736. The transconductor 730 and the complex mixer 734 form a harmonic feedforward signal path 740 having an input coupled to the node 716 and an output coupled to the node 718. The transconductor 730 has a transconductance of $-g_{m1}/3$ and the complex mixer 734 receives a reference signal 738 with a frequency of $3*f_{LO}$ so as to generate a harmonic feedforward IF signal 741 representative of the content at the third-order harmonic of $f_{LO}$. At the node 718 the harmonic feedforward IF signal 741 is subtracted from a primary IF signal 742 generated by the complex mixer 708 in the primary signal path 714, thereby effectively canceling the third-order harmonic content from the primary IF signal 742 before being filtered by the complex filter 712.

Similarly, the complex mixer 736 and the transconductor 732 form a harmonic feedforward signal path 744 having an input coupled to the node 718 and an output coupled to the node 716. The complex mixer 736 receives the reference signal 738 with the frequency $3*f_{LO}$ and the transconductor 732 has a transconductance of $-g_{m2}/3$ so as to generate a harmonic feedforward IF signal 746 representative of the content at the third-order harmonic of $f_{LO}$. At the node 716 the harmonic feedforward IF signal 746 is subtracted from a primary IF signal 748 generated by the transconductor 706 in the primary signal path, thereby effectively canceling the third-order harmonic content from the primary IF signal 748 as it is fed back to the node 716. The RF filter 700 may be coupled with the blocks in TV tuner 102 in a manner similar to RF filter 400 discussed above, where the RF output signal is available as a voltage at node 716.

Although FIG. 7 illustrates an example implementation whereby the active harmonic cancellation technique is used for only the third-order harmonic, it will be appreciated that the RF notch filter circuit 700 can be modified to cancel multiple harmonics by clocking mixers 734 and 736 by n*LO and scaling transconductors 730 and 732 by $g_m/n$, where n is the $n^{th}$ harmonic to be canceled. Moreover, as a complement to the use of the active harmonic cancellation technique, the RF notch filter circuit 700 can use passive RF filtering to further attenuate the higher-order terms for a deeper RF notch, such as through the use of an RC filter comprised of a resistor 750 and capacitor 752 coupled in parallel between a voltage reference (e.g., $V_{DD}$) and the node 716. Further, it will be appreciated that the series orders of the transconductors and mixers in the RF notch filter circuit 700 can be switched in an alternative embodiment.

Figure 8:
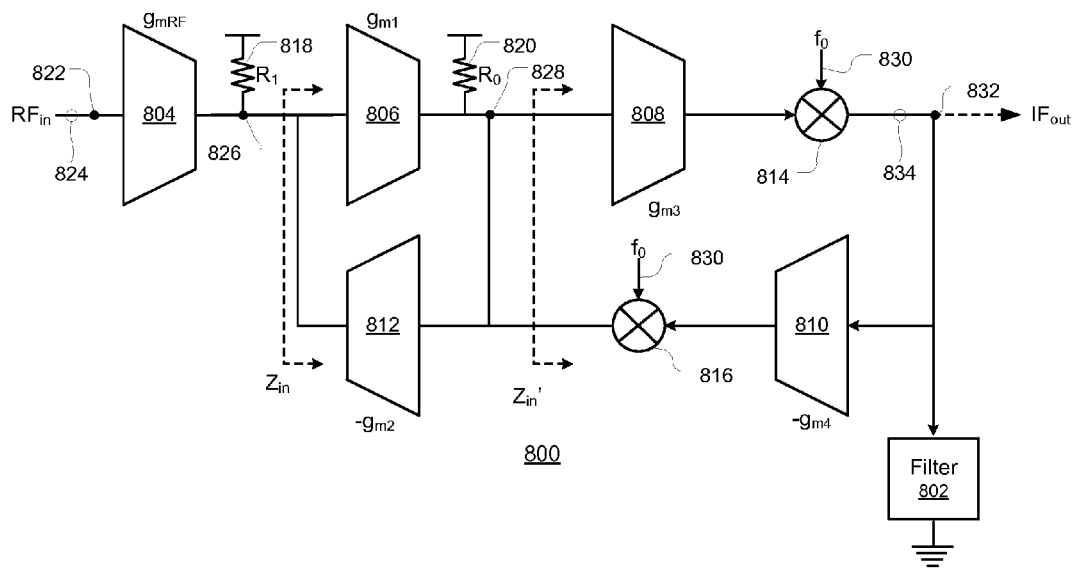
FIG. 8 is a circuit diagram illustrating an example RF band-pass filter using an IF-based active feedback signal path in accordance with at least one embodiment of the present disclosure.

FIGS. 8-11 illustrate an RF band-pass filter circuit 800 implementing the structure of the RF filter circuit 300 of FIG. 3 in accordance with at least one embodiment of the present disclosure. In the depicted example, the RF band-pass filter circuit 800 includes a current-domain filter 802, transconductors 804, 806, 808, 810, and 812, complex mixers 814 and 816, and resistors 818 and 820. The transconductor 804 (with a transconductance $g_{mRF}$) operates as a buffer and has an input coupled to a node 822 to receive an RF signal 824 and an output coupled to a node 826. The transconductor 806 (with a transconductance $g_{m1}$) has an input coupled to the node 826 and an output coupled to a node 828. The transconductor 812 (with a transconductance of $-g_{m2}$) has an input coupled to the node 828 and an output coupled to the node 826. The transconductor 808 has an input coupled to the node 828 and an output coupled to an input of the complex mixer 814. The complex mixer 814 has another input to receive a reference signal 830 and an output coupled to a node 832 to provide an IF signal 834 based on the mixing of the output signal of the transconductor 808 and the reference signal 830. The filter 802 is coupled between the node 832 and a voltage reference (e.g., ground). In one embodiment, the IF signal 834 generated by the mixer 814 is a complex IF signal and the filter 802 can be implemented as two filters, one for each of the I component and the Q component of the complex IF signal. The transconductor 810 (with transconductance $-gm_4$) has an input coupled to the node 832 and an output coupled to an input of the complex mixer 816. The complex mixer 816 has another input to receive the reference signal 830 and an output coupled to the node 828, whereby the complex mixer 816 feeds an RF signal based on the mixing of the output of the transconductor 810 and the reference signal 830 back into node 828. The resistors 818 and 820 include an electrode coupled to a voltage reference (e.g., $V_{DD}$) and an electrode coupled to the node 826 and the node 828, respectively. Although FIG. 8 illustrates a particular order of the transconductors 808 and 810 and the complex mixers 814 and 816, the orders of these transconductors and mixers can be switched in alternative embodiments.

Figure 9:
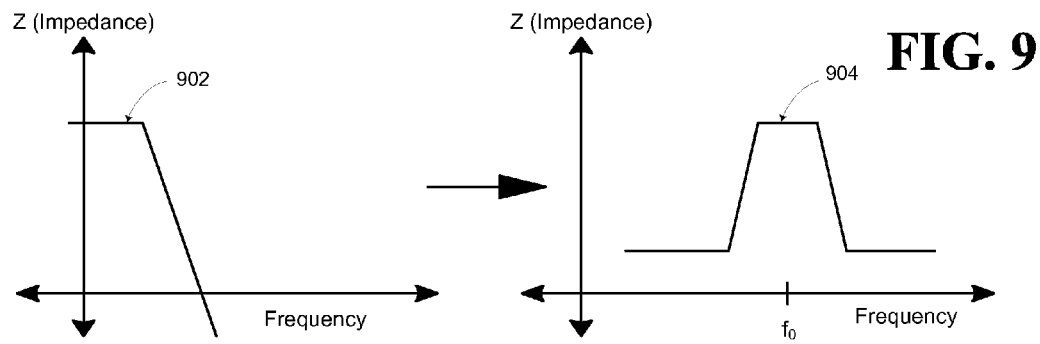
FIG. 9 is a diagram illustrating an example frequency response of the RF band-pass filter of FIG. 8 using a low-pass IF filter in accordance with at least one embodiment of the present disclosure.

The RF band-pass filter circuit 800 can be used to attenuate problematic blockers outside of a passband range centered at a frequency $f_0$ of the reference signal 830 used by the mixers 814 and 816. This band-pass filter function can be achieved through the use of either a low-pass filter or a complex band-pass filter 802. FIG. 9 illustrates an example impedance transfer function of the RF band-pass filter circuit 800 when a low-pass filter is used for the filter 802. As illustrated by FIG. 9, the operation of the RF band-pass filter circuit 800 transforms an impedance transfer function 902 of a low-pass filter implementation (centered at DC) for the filter 802 relative to node 832 into an impedance transfer function 904 of a band-pass filter, having a passband centered at frequency $f_0$, relative to the input to the RF band-pass filter circuit 800 at node 826.

The suitability of the a low-pass filter implementation for the RF band-pass filter circuit 800 is determined in part by the degree of I/Q balance that can be achieved in the low-pass filter and the mixers 814 and 816. Further, in one embodiment, the frequency $f_0$ of the reference signal 830 is set to the frequency $f_{CH}$ of the RF channel or band of interest (that is, $f_0=f_{CH}=f_{LO}$). Accordingly, for direct conversion receivers, the main reference signal of the receiver can be used as the reference signal 830. However, in receivers whereby non-zero IF is used, the use of a different reference signal is required since the clock frequency must now be at $f_{CH}+f_{IF}$ or $f_{CH}-f_{IF}$ (depending on whether high-side or low-side injection is used).

Figure 10:
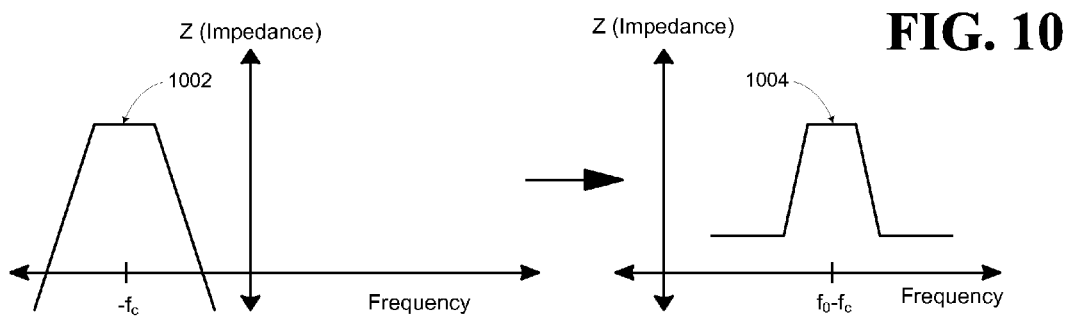
FIG. 10 is a diagram illustrating an example frequency response of the RF band-pass filter of FIG. 8 using a complex band-pass IF filter in accordance with at least one embodiment of the present disclosure.

One approach to circumvent the need to use a separate reference signal is the use of a complex band-pass filter as the filter 802 in the RF band-pass filter circuit 800. As illustrated by FIG. 10, the operation of the RF band-pass filter circuit 800 transforms an impedance transfer function 1002 of a complex band-pass filter (having a passband centered at a frequency $-f_c$) relative to node 832 into an impedance transfer function 1004 of a band-pass filter, having a passband centered at frequency $f_0-f_c$, relative to the input to the RF band-pass filter circuit 800 at node 826.

Figure 11:
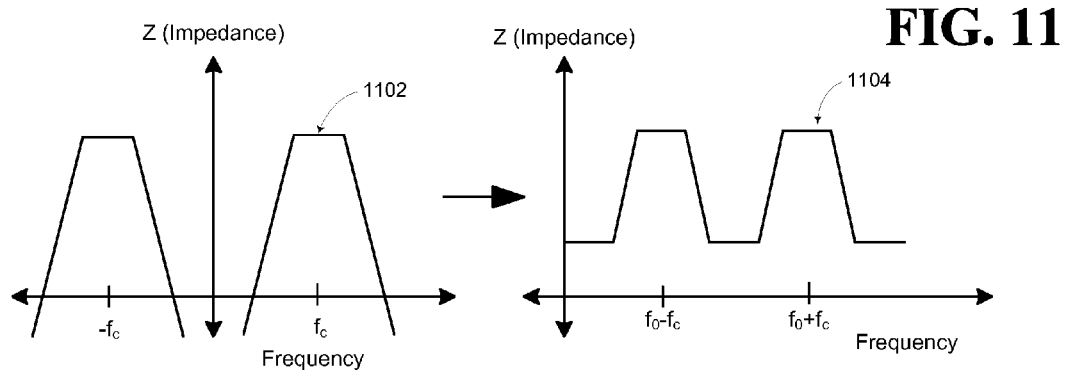
FIG. 11 is a diagram illustrating an example frequency response of the RF band-pass filter of FIG. 8 using a real band-pass IF filter in accordance with at least one embodiment of the present disclosure.

In another embodiment, the filter 802 can be implemented as a real band-pass filter centered at a frequency $+/-f_c$. As illustrated by FIG. 11, a band-pass impedance transfer function 1102 of the real band-pass filter implementation for filter 802 relative to node 832 is translated by the circuit of FIG. 8 into an impedance transfer function 1104 having two band-pass frequencies, one centered at a frequency $f_0-f_c$ and one centered at frequency $f_0+f_c$. In one embodiment, the RF band-pass filter circuit 800 illustrated in FIG. 8 can be implemented both for RF filtering and for the RF-to-IF downconversion process for the entire receiver. In this implementation, the mixer 814 is used both for the RF filtering process and for the down-mixing process. A final IF signal can be obtained after the mixer 814, or after the filtered output of the mixer 814. To illustrate, the final IF signal can be obtained as the IF signal 834 from the node 832 following the mixer 814. In this instance, the frequency $f_0$ of the reference signal 830 is set to either the sum of the channel frequency $f_{CH}$ of interest and the intermediate frequency $f_{IF}$ (that is, $f_{CH}+f_{IF}$) or the difference of the channel frequency $f_{CH}$ and the intermediate frequency $f_{IF}$ (that is, $f_{CH}-f_{IF}$). This arrangement can significantly reduce hardware overhead and power consumption because it effectively combines the separate processes of RF filtering and RF-to-IF downconversion into one shared circuit block. To illustrate with reference to the TV tuner 102 of FIG. 1, the RF signal 824 can correspond to the RF signal 130 (or a filtered representation), the IF signal 832 can correspond to the IF signal 140 of FIG. 1, and the mixer 814 can correspond to mixer 118 of FIG. 1.

Figure 12:
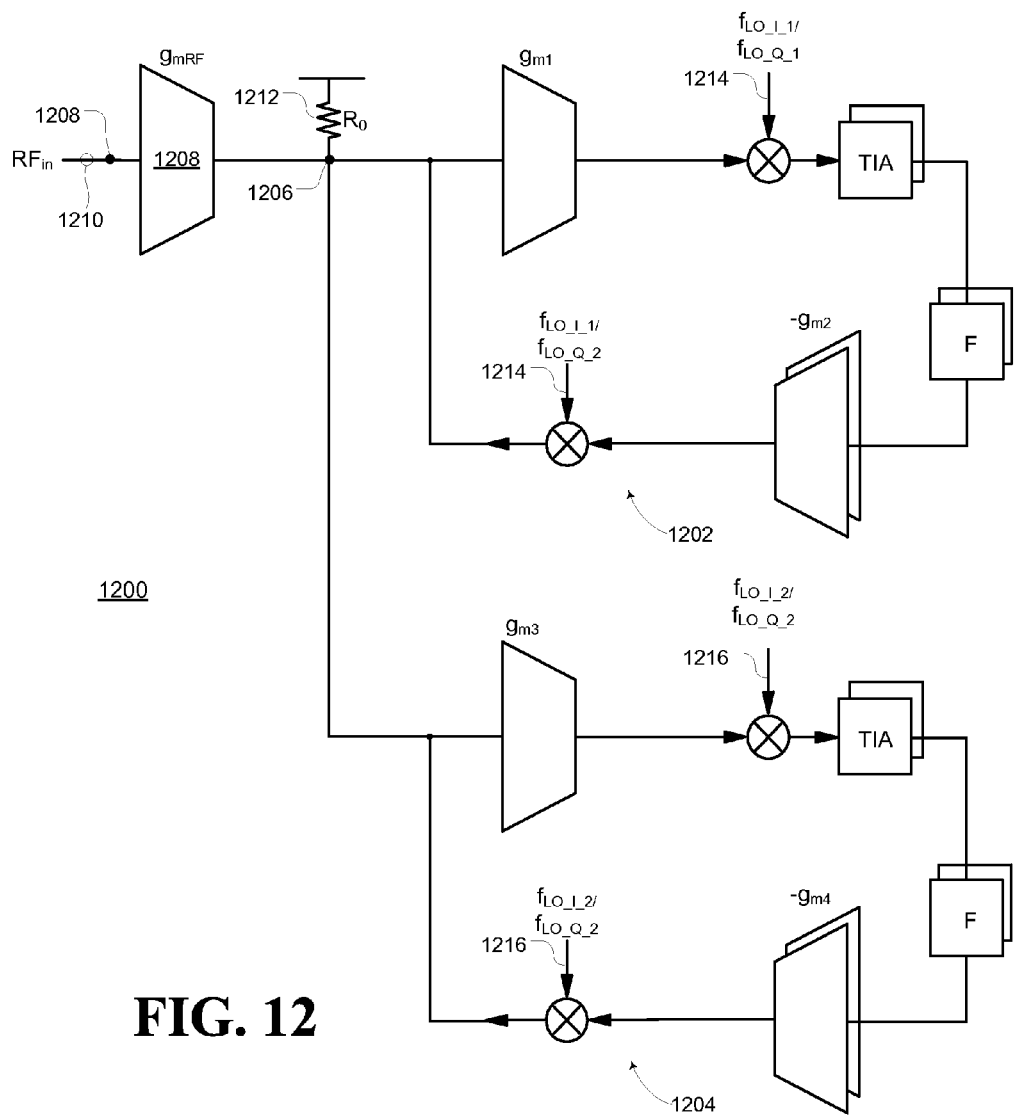
FIG. 12 is a circuit diagram illustrating a parallel RF filter configuration in accordance with at least one embodiment of the present disclosure.
Figure 13:
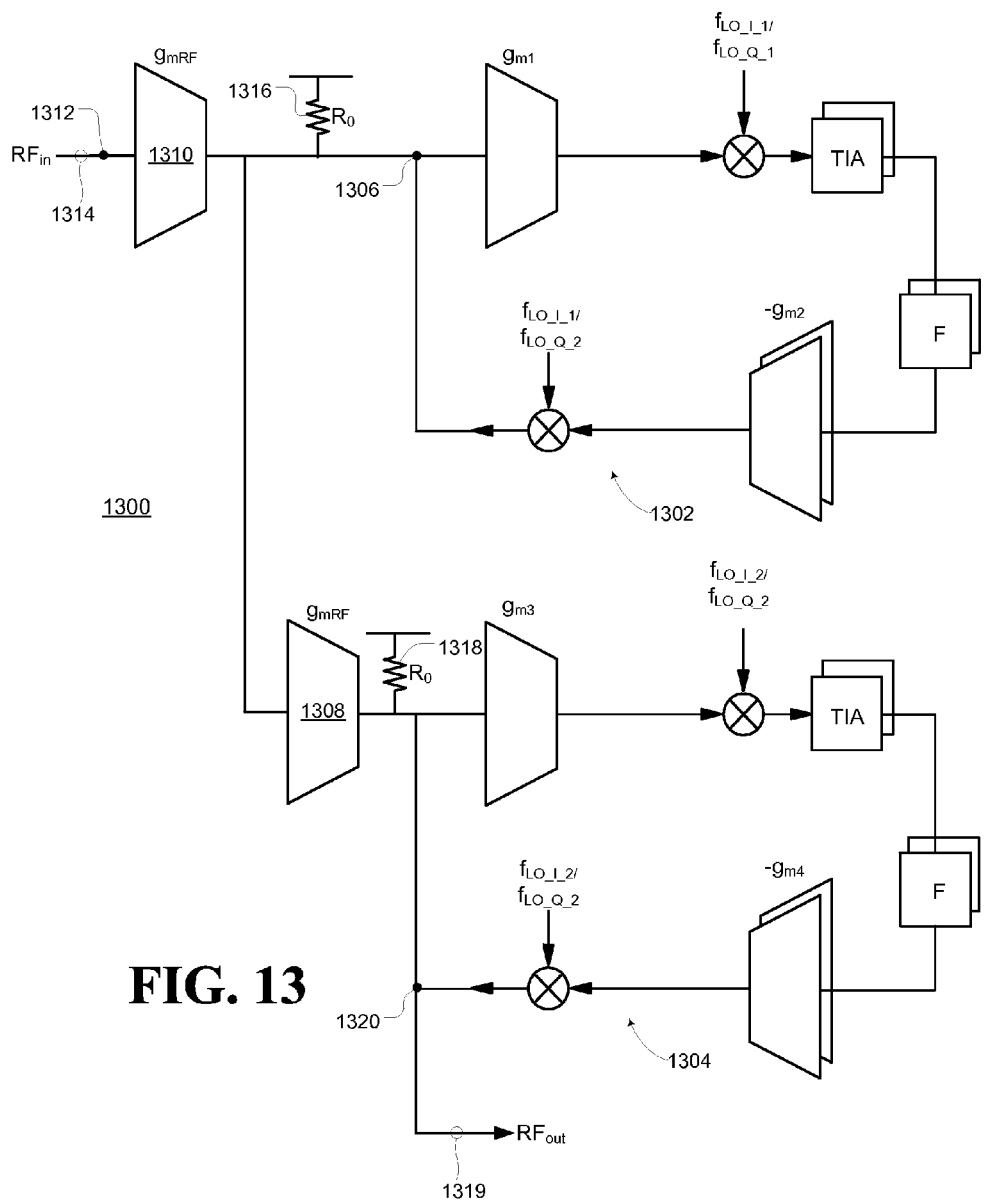
FIG. 13 is a circuit diagram illustrating a cascaded RF filter configuration in accordance with at least one embodiment of the present disclosure.

FIGS. 12 and 13 illustrate example RF filters that utilize multiple implementations of the RF notch filter circuits described above to enhance overall filter performance. The RF filters 1200 and 1300 may be coupled with the blocks in TV tuner 102 in a manner similar to RF filter 400 discussed above, where the RF output signal is available as a voltage at node 1206 or node 1320, respectively. FIG. 12 illustrates an RF filter circuit 1200 implementing two instances of the RF notch filter circuit 800 of FIG. 8, identified as RF notch circuits 1202 and 1204, in a parallel arrangement. The input of each RF notch circuit 1202 and 1204 is coupled to a node 1206. The RF filter circuit 1200 further includes a buffer transconductor 1208 coupled between the node 1206 and a node 1208 that serves as an input to receive an RF signal 1210. The RF circuit 1200 further includes a resistor 1212 having an electrode coupled to a voltage reference (e.g., VDD) and an electrode coupled to the node 1206.

In one embodiment, the reference signal 1214 used by the mixers of the RF notch circuit 1202 has a frequency $f_{LO1}$ and the reference signal 1216 used by the mixers of the RF notch circuit 1204 has a different frequency $f_{LO2}$. Under this configuration, the RF circuit 1200 provides an impedance transfer function with two notches: one notch centered at the frequency $f_{LO1}$ and one notch centered at the frequency $f_{LO2}$. This can be useful if two different frequencies need to be notched. In an alternative embodiment, the mixers of the RF notch circuit 1202 and the mixes of the RF notch 1204 may use the same reference signal, or use separate reference signals that have the same frequency $f_{LO}$. Under this arrangement, the RF filter circuit 1200 exhibits only a single notch, but the overall notch depth is increased by approximately 6 dB compared to an implementation with only a single RF notch circuit.

FIG. 13 illustrates an RF filter circuit 1300 implementing two instances of the RF notch filter circuit 800 of FIG. 8, identified as RF notch circuits 1302 and 1304, in a cascaded arrangement. The input of the RF notch circuit 1304 is coupled to a node 1306 via a buffer transconductor 1308. The RF filter circuit 1300 further includes a buffer transconductor 1310 coupled between the node 1306 and a node 1312 that serves as an input to receive an RF signal 1314. The RF circuit 1300 further includes a resistor 1316 having an electrode coupled to a voltage reference (e.g., $V_{DD}$) and an electrode coupled to the node 1306, and a resistor 1318 having an electrode coupled to the voltage reference and an electrode coupled to the output of the buffer transconductor 1308 and the input of the RF notch circuit 1304. In this cascaded implementation, the RF circuit 1300 is connected in series in the main processing signal path for the RF signal 1314, whereby the resulting filtered RF signal 1319 can be provided from a node 1320 of the RF notch filter circuit 1304. When both RF notch circuit 1302 and notch circuit 1304 are clocked using the same reference signal, or separate reference signals having the same frequency, the illustrated configuration can provide an overall impedance transfer function having a notch depth that is twice the notch depth of either RF notch circuit 1302 or notch circuit 1304 alone.

Although FIGS. 12 and 13 illustrate example implementations of two RF filter circuits in a parallel arrangement or cascaded arrangement, the present disclosure is not limited to the use of only two parallel or cascaded RF filter circuits. Rather, any number of parallel or cascaded RF filter circuits may be used in accordance with the scope of the present disclosure. Further, while FIGS. 12 and 13 are illustrated with the example use of the RF notch filter circuit of FIG. 8, other RF notch filter circuits or RF band-pass circuits can be used. That is, the principles illustrated by FIGS. 12 and 13 can be extended to include any number or combinations of notch filters and band-pass filters. Further, the order of the transconductors and the mixers of one or both of the RF notch circuits illustrated in FIGS. 12 and 13 can be switched in alternative embodiments.

While FIGS. 4-13 illustrate particular example implementations of the RF filter circuits 200 and 300 of FIGS. 2 and 3, respectively, the present disclosure is not limited to these examples. Rather, using the guidelines provided herein, an RF filter circuit can be implemented to use any of a variety of current-domain filters that also present an impedance transfer function on the RF signal path, such as active current domain filters or passive filters, such as resistor-capacitor (RC) circuits or resistor-inductor-capacitor (RLC) circuits.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:
1. A system comprising:
   a radio frequency (RF) filter circuit comprising:
   a filter;
   a first node;
   a second node coupled to the filter;
   a conversion signal path having an input coupled to the first node and an output coupled to the second node, the conversion signal path comprising an active mixer coupled between the first node and the second node;
   a feedback signal path having an input coupled to the second node and an output coupled to the first node, the feedback signal path comprising a first transconductor and a first mixer coupled in series between the second node and the first node;
   a second transconductor having an input coupled to a third node to receive an RF signal and an output coupled to the first node; and
   a third transconductor having an input coupled to the first node and an output coupled to the third node.
2. The system of claim 1, wherein:
   the filter comprises a low-pass filter;
   the first mixer and the active mixer receive a reference signal having a select frequency; and
   the RF filter circuit has an impedance transfer function comprising a passband centered at the select frequency.

3. The system of claim 1, wherein:
the filter comprises a complex band-pass filter having a passband centered at a first frequency;
the first mixer and the active mixer receive a reference signal having a second frequency; and
the RF filter circuit has an impedance transfer function comprising a passband centered at a frequency representing the sum of the second frequency and the first frequency.

4. The system of claim 1, further comprising:
a fourth transconductor having an input to receive an RF signal at a fourth node and an output coupled to the third node.

5. The system of claim 4, wherein:
the filter comprises a low-pass filter;
the first mixer and the active mixer receive a reference signal having a select frequency; and
the RF filter circuit has an impedance transfer function comprising a passband centered at the select frequency.

6. The system of claim 4, wherein:
the filter comprises a complex band-pass filter having a passband centered at a first frequency;
the first mixer and the active mixer receive a reference signal having a second frequency; and
the RF filter circuit has an impedance transfer function comprising a passband centered at a frequency representing the sum of the second frequency and the first frequency.

7. The system of claim 4, further comprising:
an output coupled to the second node, the output to provide an intermediate frequency (IF) signal that is a filtered representation of signal content of the RF signal.

8. A system comprising a radio frequency (RF) filter circuit comprising:
a filter;
a first node;
a second node coupled to the filter;
a conversion signal path having an input coupled to the first node and an output coupled to the second node the conversion signal path comprising an active mixer coupled between the first node and the second node;
a feedback signal path having an input coupled to the second node and an output coupled to the first node the feedback signal path comprising a first transconductor and a first mixer coupled in series between the second node and the first node;
wherein the active mixer comprises a second transconductor and a second mixer coupled in series between the first node and the second node; and
wherein:
the second transconductor comprises an input coupled to the first node and an output;
the second mixer comprises a first input coupled to the output of the second transconductor, a second input to receive a reference signal, and an output coupled to the second node;
the first transconductor comprises an input coupled to the second node and an output; and
the first mixer comprises a first input coupled to the output of the first transconductor, a second input to receive a reference signal, and an output coupled to the first node.

9. The system of claim 8, wherein the conversion signal path further comprises a transimpedance amplifier connected in series between the first node and the second node.

10. The system of claim 8, wherein:
the second mixer comprises a first input coupled to the first node, a second input to receive a reference signal, and an output;
the second transconductor comprises an input coupled to the output of the second mixer and an output coupled to the second node;
the first mixer comprises a first input coupled to the second node, a second input to receive a reference signal, and an output; and
the first transconductor comprises an input coupled to the output of the first mixer and an output coupled to the first node.

11. The system of claim 8, wherein the filter comprises a first filter, the conversion signal path comprises a first conversion signal path and the feedback signal path comprises a first feedback signal path, the RF filter circuit further comprising:
a second filter;
a third node coupled to the second filter;
a second conversion signal path having an input coupled to the first node and an output coupled to the third node, the second conversion signal path comprising a second transconductor and a second mixer coupled in series between the first node and the third node; and
a second feedback signal path having an input coupled to the third node and an output coupled to the first node, the second feedback signal path comprising a third transconductor and a third mixer coupled in series between the third node and the first node.

12. The system of claim 11, further comprising:
a fourth transconductor having an input to receive an RF signal and an output coupled to the first node.

13. The system of claim 8, wherein the filter comprises a first filter, the conversion signal path comprises a first conversion signal path and the feedback signal path comprises a first feedback signal path, the RF filter circuit further comprising:
a second filter coupled to a third node;
a second conversion signal path having an input coupled to a fourth node and an output coupled to the third node, the second conversion signal path comprising a second transconductor and a second mixer coupled in series between the fourth node and the third node;
a second feedback signal path having an input coupled to the third node and an output coupled to the fourth node, the second feedback signal path comprising a third transconductor and a third mixer coupled in series between the third node and the fourth node; and
a fourth transconductor having an input coupled to the first node and an output coupled to the fourth node.

14. The system of claim 13, further comprising:
a fifth transconductor having an input to receive an RF signal and an output coupled to the first node.

15. The system of claim 8, wherein the filter comprises a first filter having a first center frequency and the RF filter circuit further comprises a second filter coupled to the second node, the second filter having a second center frequency.

16. A system comprising:
a radio frequency (RF) filter circuit comprising:
a filter coupled between a first node and a second node;
a primary conversion signal path having an input coupled to a third node and an output coupled to the first node, the primary conversion signal path comprising a first transconductor and a first mixer coupled in series between the third node and the first node, the first mixer to receive a first reference signal having a first frequency $f_{LO}$;

a first harmonic feedforward signal path having an input coupled to the third node and an output coupled to the first node, the first harmonic feedforward signal path having a second transconductor and a second mixer coupled in series between the third node and the first node, the second mixer to receive a second reference signal having a frequency $n*f_{LO}$, wherein n is a positive odd integer;

a feedback signal path having an input coupled to the second node and an output coupled to the third node, the feedback signal path comprising a third transconductor and a third mixer coupled in series between the second node and the third node, the third mixer to receive the first reference signal; and a second harmonic feedforward signal path having an input coupled to the second node and an output coupled to the third node, the second harmonic feedforward signal path having a fourth transconductor and a fourth mixer coupled in series between the second node and the third node, the fourth mixer to receive the second reference signal.

17. The system of claim 16, further comprising:
a fifth transconductor having an input to receive an RF signal and an output coupled to the third node.

18. The system of claim 16, wherein:
the filter comprises a low-pass filter; and
the RF filter circuit has an impedance transfer function comprising a notch at the first frequency.

19. The system of claim 16, wherein:
the filter comprises a complex band-pass filter having a passband centered at a third frequency; and
the RF filter circuit has an impedance transfer function comprising a notch at a frequency representing the sum of the first frequency and the third frequency.

20. The system of claim 16, wherein:
the filter comprises a real band-pass filter having a passband centered at a third frequency; and
the RF filter circuit has an impedance transfer function comprising two notches one centered at a frequency representing the sum of the first frequency and the third frequency and the second notch centered at a frequency representing the difference of the first frequency and the third frequency.

21. The system of claim 16, further comprising:
a receiver comprising the RF filter circuit.

22. The system of claim 8, wherein:
the filter comprises a real band-pass filter having a passband centered at a first frequency;
the first mixer and the active mixer receive a reference signal having a second frequency; and
the RF filter circuit has an impedance transfer function comprising two notches, one centered at a frequency representing the sum of the second frequency and the first frequency and the second notch centered at a frequency representing the difference of the second frequency and the first frequency.

23. The system of claim 8, further comprising:
a second transconductor having an input to receive an RF signal at a third node and an output coupled to the first node.

24. The system of claim 23, wherein:
the filter comprises a real band-pass filter having a passband centered at a first frequency;
the first mixer and the active mixer receive a reference signal having a second frequency; and
the RF filter circuit has an impedance transfer function comprising two notches, one centered at the sum of the first frequency and the second frequency and the second notch centered at the difference of the second frequency and the first frequency.

* * * * *